United States Patent [19]

Van Engelen et al.

[11] Patent Number: 5,120,034
[45] Date of Patent: Jun. 9, 1992

[54] TWO-STEP POSITIONING DEVICE USING LORENTZ FORCES AND A STATIC GAS BEARING

[75] Inventors: Gerard Van Engelen; Adrianus G. Bouwer, both of Eindhoven, Netherlands

[73] Assignee: U.S. Philips Corp., New York, N.Y.

[21] Appl. No.: 594,520

[22] Filed: Oct. 4, 1990

[30] Foreign Application Priority Data

Oct. 5, 1989 [NL] Netherlands ........................ 8902471

[51] Int. Cl.$^5$ .............................................. B23Q 1/02
[52] U.S. Cl. .................................................... 269/73
[58] Field of Search ................... 269/73, 20; 414/676, 414/749; 104/281, 283, 286; 310/90.5; 384/8, 100

[56] References Cited

U.S. PATENT DOCUMENTS

| | | | |
|---|---|---|---|
| 4,129,291 | 12/1978 | Kato et al. | 269/73 |
| 4,492,356 | 1/1985 | Taniguchi et al. | 269/73 |
| 4,630,942 | 12/1986 | Tsumaki et al. | 269/73 |
| 4,684,315 | 8/1987 | Sugishima et al. | 269/73 |
| 4,887,804 | 12/1989 | Ohtsuka | 269/73 |

Primary Examiner—Robert C. Watson
Attorney, Agent, or Firm—Steven R. Biren

[57] ABSTRACT

A positioning device includes a table (101, 213) guided by a carriage (15, 199), the carriage (15, 199) being displaceable in two coordinate directions (X, Y) with respect to the base (3) and the table (101, 213) being displaceable with respect to the carriage (15, 199) in the same coordinate directions (X, Y) solely by Lorentz forces, while in a third coordinate direction (Z) the position of the table (101, 213) is determined by a static gas bearing. The two-step positioning device is particularly suitable for use in opto-lithographic devices.

4 Claims, 6 Drawing Sheets

TWO-STEP POSITIONING DEVICE USING LORENTZ FORCES AND A STATIC GAS BEARING

BACKGROUND OF THE INVENTION

The invention relates to a positioning device comprising a carriage displaceable in at least two coordinate directions (X, Y) with respect to a base and intended for displacement of a table which is displaceable with respect to the carriage in the said coordinate directions.

In a known positioning device of the kind mentioned above (see "Bulletin of the Japan Society of Precision Engineering", Vol. 22, No. 1, March, '88, pp. 13–17), the table is coupled by four flexible rods to the carriage. The displacement of the table with respect to the carriage is obtained by three so-called piezo-actuators, which are each secured near one end to the carriage and are secured near the other end to the table. The carriage constitutes an upper support of a so-called cross table, which further has a lower support. The lower and upper supports can be displaced in the X and Y coordinate directions, respectively, the displacement of the lower support in the X coordinate direction also resulting in a displacement of the upper support in this direction. The displacement of an object lying on the table is effected by a coarse displacement of the carriage (upper support) followed by a fine displacement of the table with respect to the carriage.

A disadvantage of the known two-stage positioning device described is that the mechanical coupling between the table and a carriage acting as the upper support in a cross table in a controlled system results in bandwidth-limiting natural (Eigen) frequencies. The friction in the guides of the supports in the cross table moreover considerably limits the accuracy of the positioning device.

SUMMARY OF THE INVENTION

The invention has for its object to provide a positioning device, in which the disadvantages described above are avoided.

The positioning device according to the invention is for this purpose characterized in that in operation the table is coupled to the carriage solely by Lorentz forces of magnet systems and coil systems and occupies, viewed in a third coordinate direction (Z) transverse to the said coordinate directions (X, Y), a position with respect to the carriage which is determined by a static gas bearing acting between the base and the table.

Due to the fact that the table is coupled to the carriage not mechanically, but via Lorentz forces and is directly supported on the base with a comparatively stiff static gas bearing, a large bandwidth of the system is obtained with an optimal positioning accuracy. The specific construction of the drive required for the displacement of the carriage plays a subordinate part for the attainable bandwidth. It should be noted that the term "Lorentz force" is to be understood to mean the force which is the vectorial product of the magnetic induction $\overline{B}$ and the current strength $\overline{i}$.

A first embodiment of the positioning device is provided with a coil system secured to a support and guide for the carriage displaceable in one (X) of the coordinate directions and with a further coil system secured to the carriage, while the table is provided with magnet systems arranged opposite to the two said coil systems, coil systems and magnet systems corresponding to each other constituting linear electric motors for the displacement and guiding of the table with respect to the carriage in the Y coordinate direction and in the X coordinate direction, respectively. The coil system secured on the support yields a comparatively rapid and accurate displacement of the table in the Y coordinate direction.

A second embodiment of the positioning device is provided with a carriage guided by a first support displaceable in the X coordinate direction and by a second support displaceable in the Y coordinate direction, while the table is provided with magnet systems arranged opposite to coil systems in the carriage, magnet systems and coil systems corresponding to each other constituting linear electric motors for the displacement and guiding of the table with respect to the carriage in the X coordinate direction and in the Y coordinate direction, respectively. Due to the fact that all coil systems are secured on the carriage, a favorable operating temperature is obtained.

A third embodiment of the positioning device is provided with a position sensor, which is coupled to the table and of which during operation a position signal determines a difference signal of a control device, which defines an end position of the table, which control device comprises a first feedback control of the carriage and a second feedback control of the table operating simultaneously and having a common set-point generator, the set-point generator generating in the first feedback control a series of set points guaranteeing the position of the carriage within a margin determined by the second feedback control of the table in a linear force-current range of the relevant magnet systems and coil systems. The linearity permits obtaining a comparatively simple control of the table.

BRIEF DESCRIPTION OF THE DRAWING

The invention will be described more fully with reference to the drawing, in which.

DESCRIPTION OF THE PREFERRED EMBODIMENTS

Figure 1:
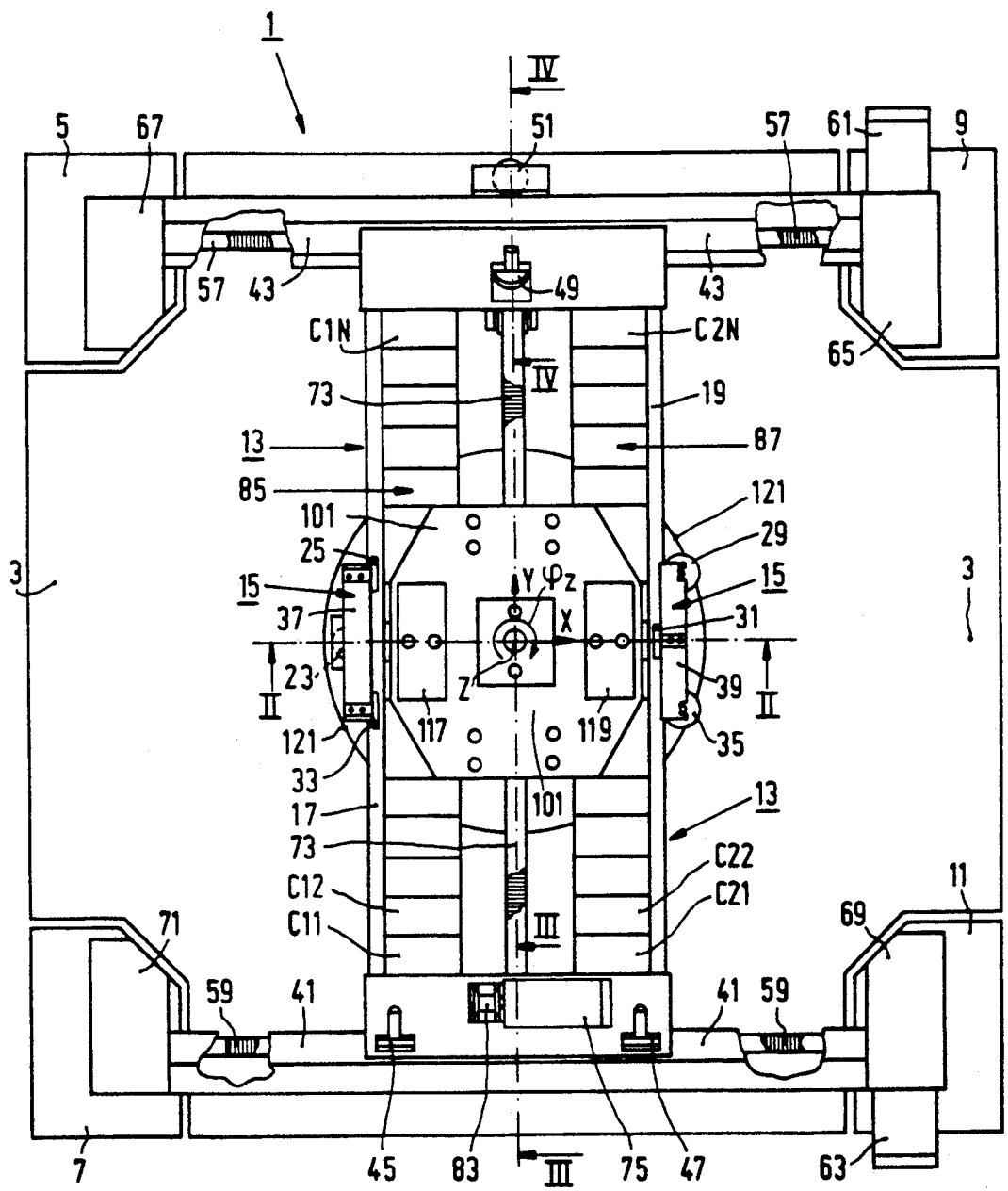
FIG. 1 is a plan view of the first embodiment of a positioning device according to the invention.
Figure 2:
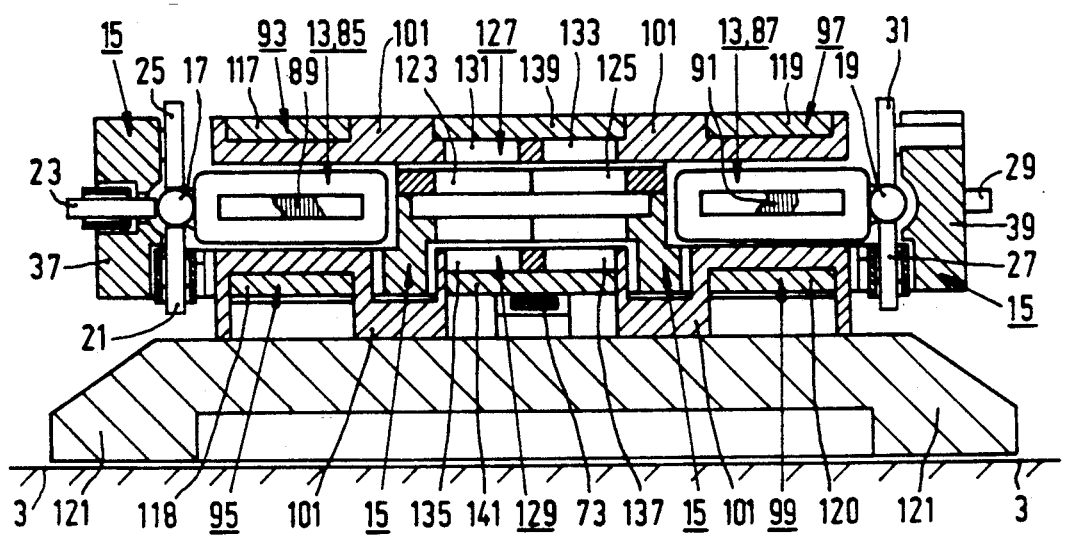
FIG. 2 is a sectional view on an enlarged scale taken on the line II—II in FIG. 1.
Figures 3, 4:
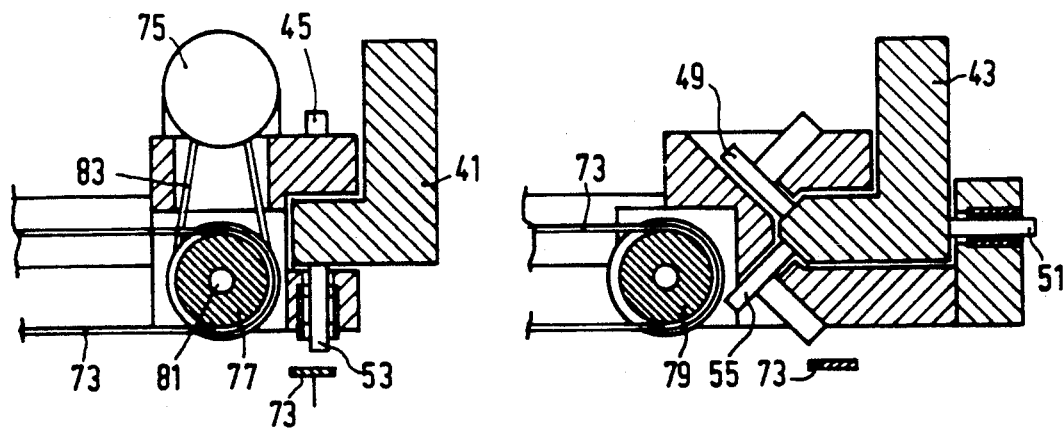
FIG. 3 is a sectional view on an enlarged scale taken on the line III—III in FIG. 1.
FIG. 4 is a sectional view on an enlarged scale taken on the line IV—IV in FIG. 1.
Figure 6:
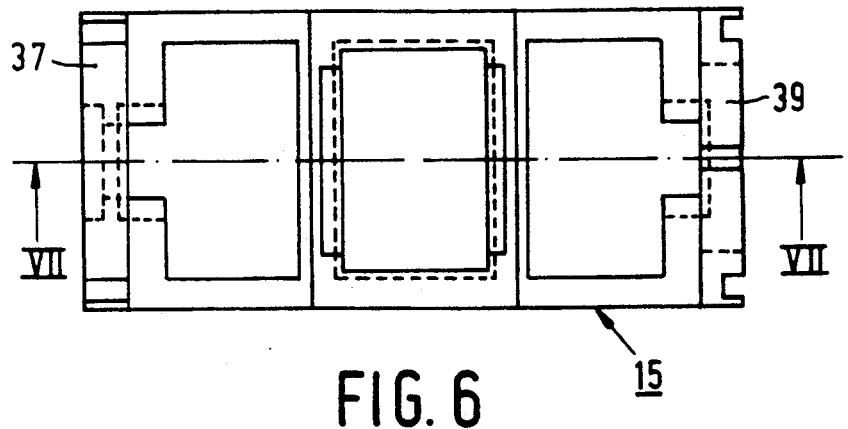
FIG. 6 is a plan view of a separate carriage as shown in FIG. 5.
Figure 7:
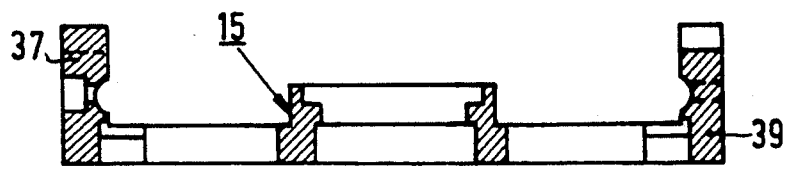
FIG. 7 is a sectional view taken on the line VII—VII in FIG. 6.

The first embodiment of the positioning device 1 illustrated in FIGS. 1 and 2 has a plate-shaped base 3 of granite extending in a horizontal plane parallel to the XY plane indicated in FIG. 1. Near the four corners of the rectangular base 3, vertical stays 5, 7, 9 and 11 are provided, on which a drive for a support 13 displaceable in the X coordinate direction for a carriage 15 displaceable with respect to this support in the Y coordinate direction is secured. The support 13 has two guides 17 and 19 extending parallel to the Y coordinate direction and having the form of round metal rods, over which the carriage 15 is movable as a hanging cart by means of rollers (21, 23, 25) on the lefthand side in FIG. 2 and rollers (27, 29, 31) on the righthand side in FIG. 2. In FIG. 1, further rollers 33 and 35 are visible, by means of which the carriage 15 is movable over the guides 17 and 19. All the rollers 21-35 are rotatably journalled in side walls 37 and 39 of the carriage 15 (see also FIGS. 6 and 7). Two guides 41 and 43 extending parallel to the X coordinate direction are secured on the base 3 (see FIGS. 1, 3, 4), and the support 13 is movable in the X coordinate direction over said guides by means of rollers (45, 47) on the lower side of FIG. 1 and rollers (49, 51) on the upper side of FIG. 1. In FIGS. 3 and 4, further rollers 53 and 55, respectively, are visible, by means of which the support 13 is movable over the guides 41 and 43.

Both the support 13 and the carriage 15 are displaced with respect to the base and with respect to the support 13, respectively, by means of toothed belt drives. In the case of the support 13, two toothed belts 57 and 59 (see FIG. 1) are driven by stepping motors 61 and 63, respectively, which are secured on the stays 9 and 11. The stepping motor 61 drives a toothed roller 65, around which the toothed belt 57 secured to the support 13 is wrapped, which is further guided around the toothed roller 67 rotatably journalled on the stay 5. The stepping motor 63 drives a toothed roller 69, around which the toothed belt 59 secured to the support 13 is wrapped, which is further guided around a toothed roller 71 rotatably journalled on the stay 7. In the case of the carriage 15, a toothed belt 73 secured to the carriage is driven by a stepping motor 75 arranged on the carriage. The toothed belt 73 is guided around toothed rollers 77 and 79 (see FIGS. 3 and 4), which are rotatably journalled on the carriage 15. The roller 77 is secured on a shaft 81, on which a further toothed roller (not shown in the drawing) is secured, around which a further toothed belt 83 is wrapped (see FIGS. 1 and 3), which is driven by a further toothed roller (not shown) driven by the stepping motor 75 and connected to the motor shaft.

As appears from FIGS. 1, 2, 8 and 9, the support 13 displaceable in the X coordinate direction is provided with two elongate equal coil systems 85 and 87, which extend parallel to the Y coordinate direction and are each composed of two coils C1 and C2 having per coil parts alternately wound in opposite senses. The two coils C1 and C2 are wound in such a manner around cores 89 and 91 (see FIG. 2) that in each of the coil systems 85 and 87 sections are formed of pairs of coil parts belonging to different coils and wound in the same sense, the pairs thus formed being alternately wound in opposite senses. If each of the coils C1 and C2 is provided with an ascending enumeration of successive coil parts, the following row is formed: C11 C21, C12 C22, ... C1N C2N, where C11 and C21 are wound in the same sense, whereas the pairs C11, C21 and C12, C22 are wound in opposite senses.

On the upper and lower sides of the support 13 with the coil systems 85 and 87, magnet systems (93, 95) and magnet systems (97, 99) are provided, which correspond to these coil systems.

Figure 5:
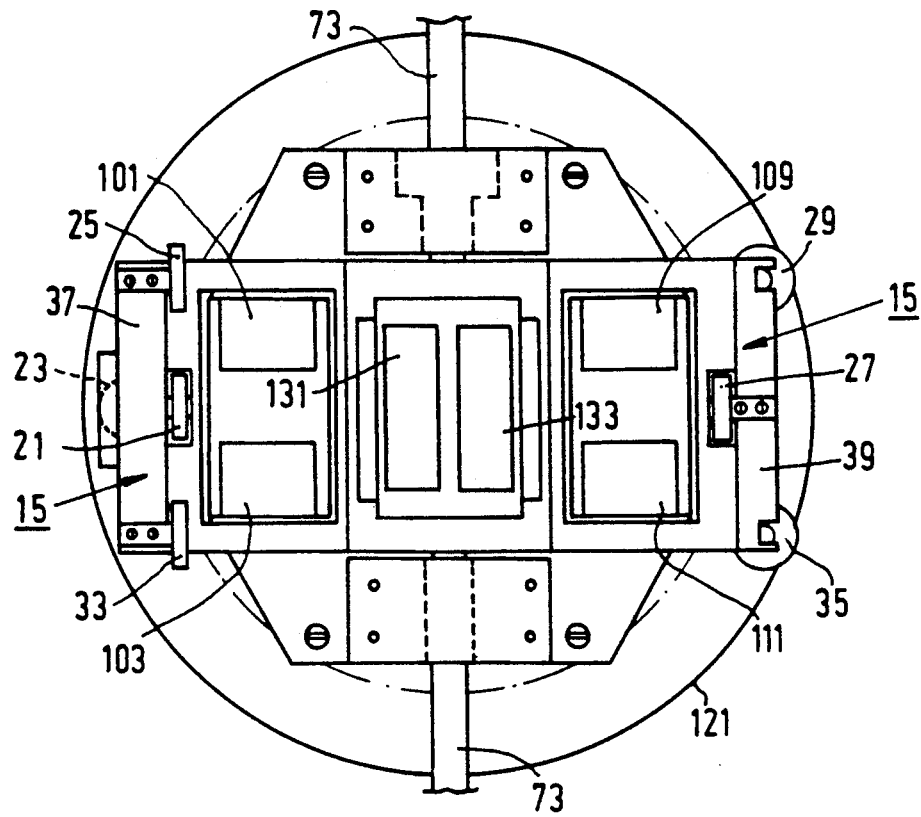
FIG. 5 is a plan view on an enlarged scale of a carriage and a lower part of the table indicated in FIGS. 1 and 2.
Figure 8:
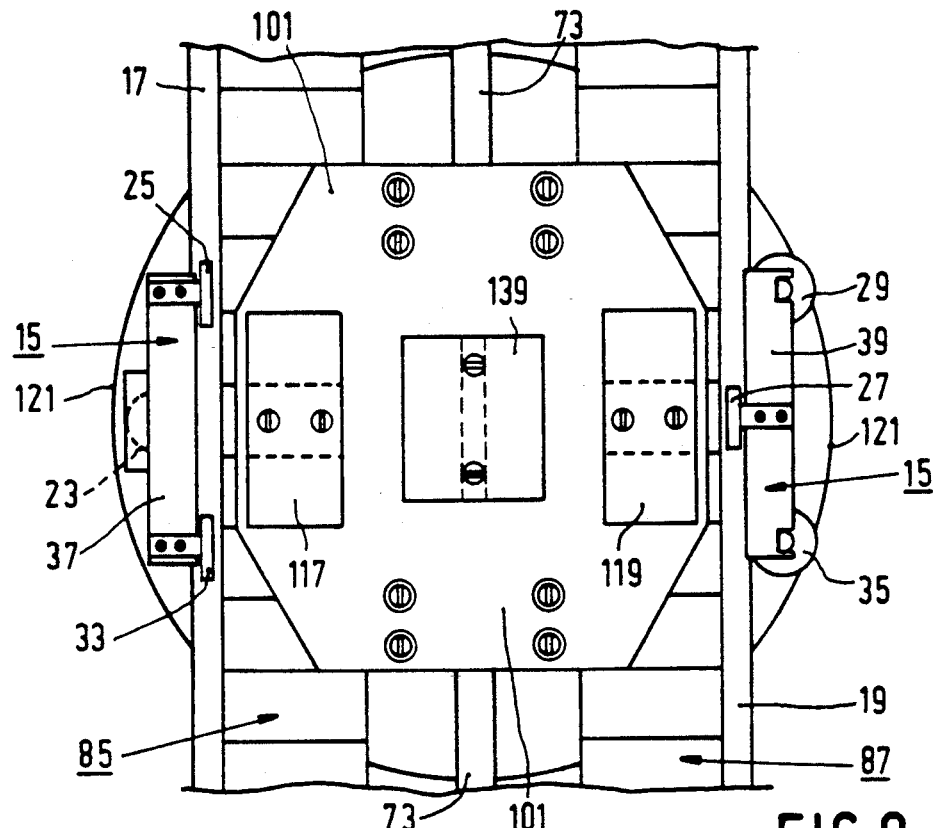
FIG. 8 is a plan view of a carriage and a table as used in the positioning device shown in FIG. 1.
Figure 9:
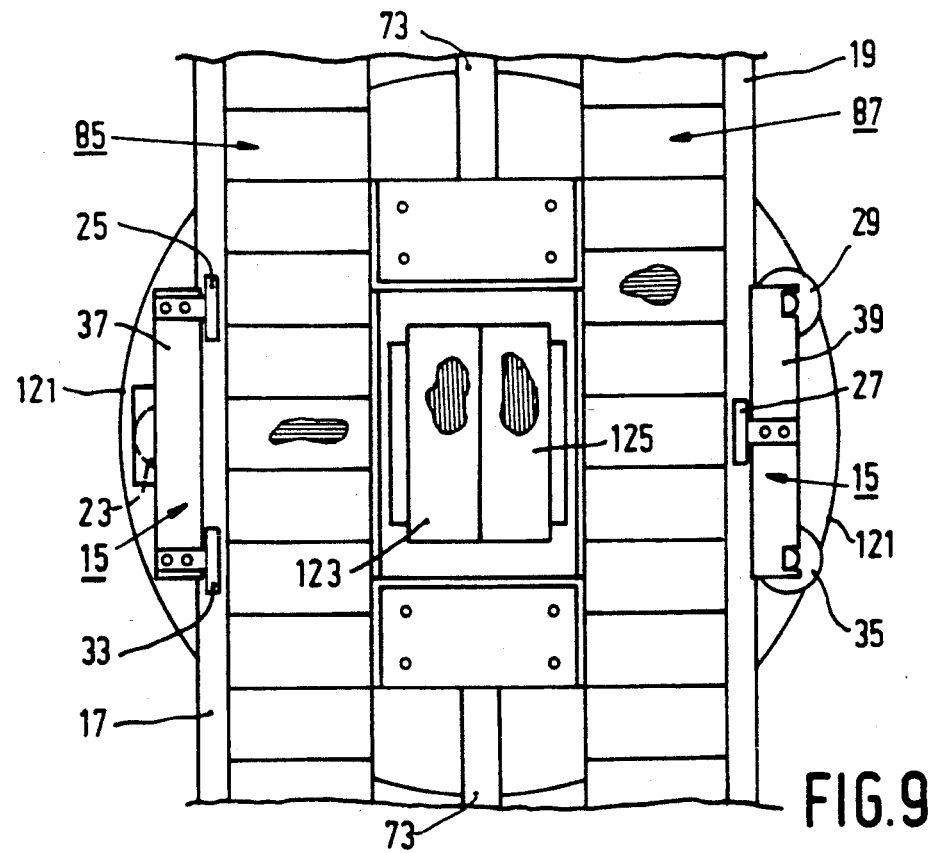
FIG. 9 is a plan view of a carriage, a lower magnet holder of the table and a part of a drive of the carriage for the Y coordinate direction as used in the positioning device shown in FIG. 1.
Figure 10:
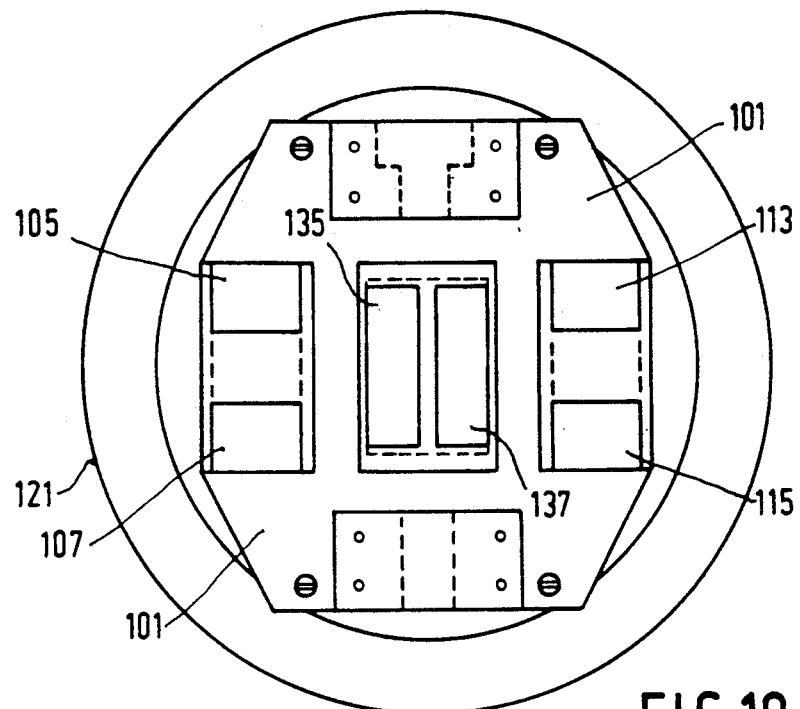
FIG. 10 is a plan view of a lower part of the table as used in the positioning device shown in FIG. 1.

The magnet systems (93, 95) and magnet systems (97, 99) secured to a table 101 displaceable in the X coordinate direction and in the Y coordinate direction constitute together with the corresponding coil systems 85 and 87 linear electric motors for the displacement in the Y coordinate direction of the table 101 with respect to the carriage 15. This relative displacement in the Y coordinate direction is obtained in that the relevant sections of the coils C1 and C2 are commuted at the correct instant. This may be effected, for example, by means of proximity switches or position sensors. Each of the magnet systems 93, 95, 97 and 99 comprises two permanent magnets (101, 103), (105, 107), (109, 111) and (113, 115), respectively, as indicated in FIGS. 2, 5 and 10. The two magnets of each pair are magnetized in opposite senses in a direction parallel to the Z coordinate direction and are coupled to each other by plate-shaped magnetically conducting bridges. In FIGS. 1 and 8, these bridges are indicated for the magnet systems 93 and 97 by reference numerals 117 and 119. In FIG. 2, the bridges are indicated for the magnet systems 95 and 99 by reference numerals 118 and 120. A foot 121 is secured to the table 101 and this foot is journalled on the base 3 (see FIGS. 1 and 2). The journalling is effected by means of an aerostatic bearing (static gas bearing) of a kind known as such from European Patent Application EP-A1-0244012.

The carriage 15 is provided with a coil system (a further coil system), which comprises two coils 123 and 125 wound in opposite senses (see FIGS. 2 and 9), which constitute together with an upper magnet system 127 and a lower magnet system 129, respectively, linear electric motors for the displacement of the table 101 with respect to the carriage 15 in the X coordinate direction. The upper magnet system 127 comprises two permanent magnets 131 and 133 magnetized parallel to the Z coordinate direction in opposite senses, while the lower magnet system 129 comprises two permanent magnets 135 and 137, which are magnetized in opposite senses parallel to the Z coordinate direction. A plate-shaped magnetically conducting bridge 139 connects the magnets 131 and 133 to each other and a plate-shaped magnetically conducting bridge 141 connects the magnets 135 and 137 to each other.

The operation and the control of the second embodiment of the positioning will now be described. In principle, the operation and the control of both positioning devices are the same.

Figure 11:
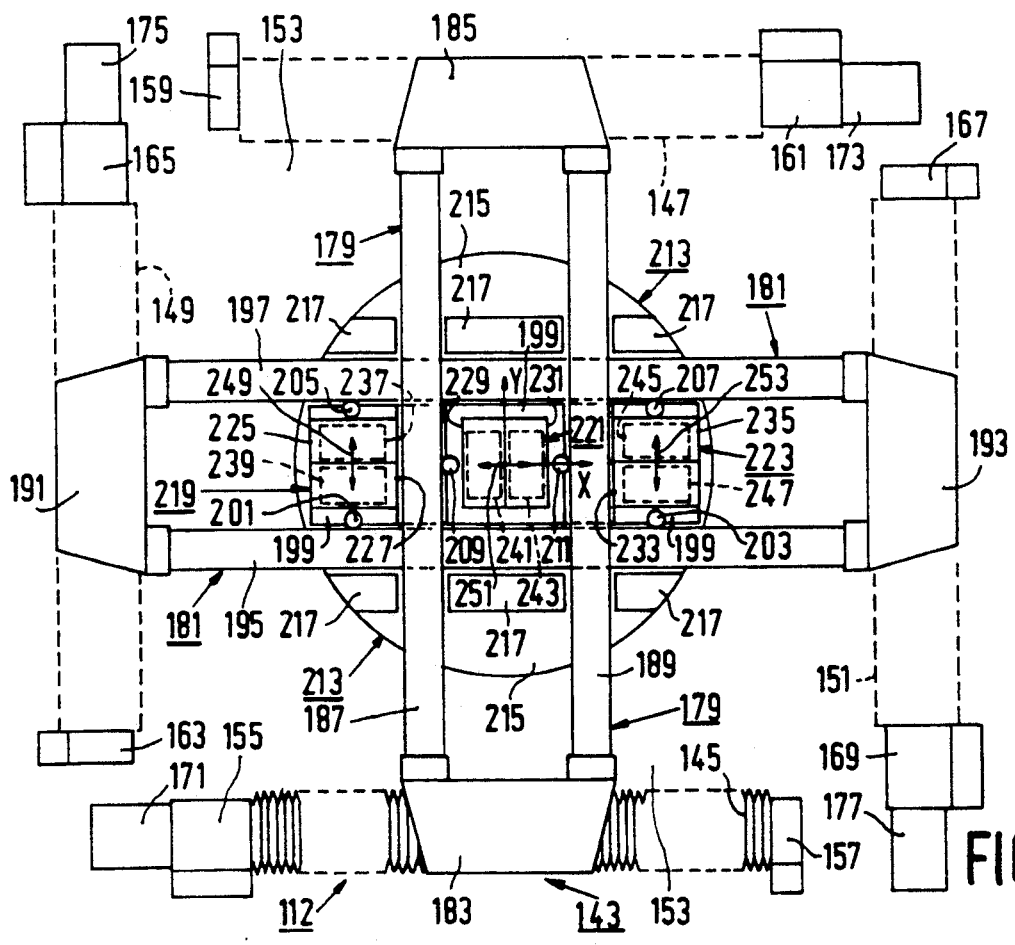
FIG. 11 is a plan view of the second embodiment of a positioning device according to the invention.
Figure 12:
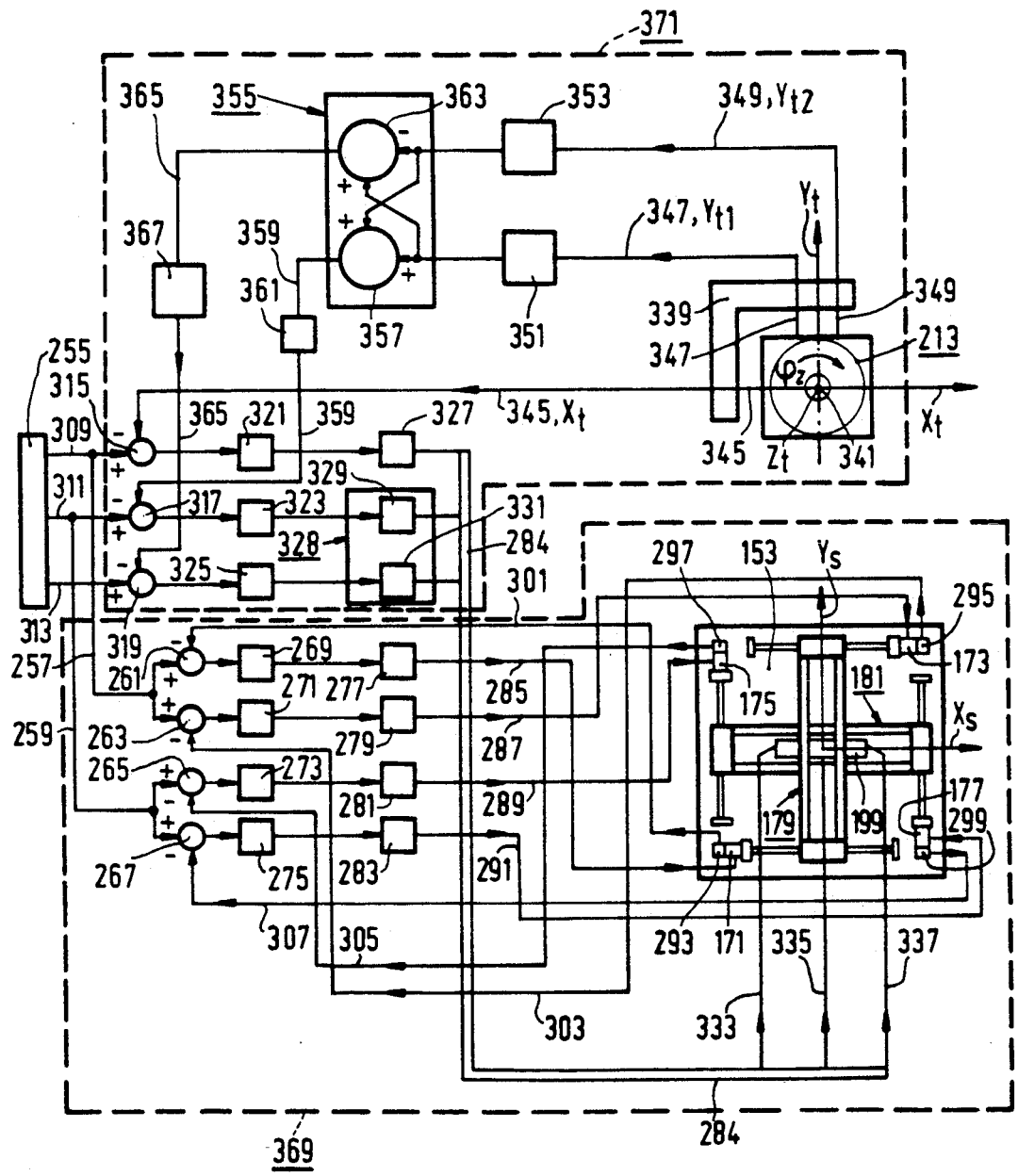
FIG. 12 shows a part of the second embodiment of a positioning device according to the invention.

The second embodiment of the positioning device 143 shown in FIGS. 11 and 12 comprises four screw spindles 145, 147, 149 and 151, which are secured on a horizontal plate-shaped base 153 of, for example, granite. The screw spindles (145, 147) extending parallel to the X coordinate direction are rotatable in bearings (155, 157) and bearings (159, 161), respectively, which are mounted on the base 153, while the screw spindles (149, 151) extending parallel to the Y coordinate direction are rotatable in bearings (163, 165) and bearings (167, 169), respectively, which are also mounted on the base 153. The screw spindles 145, 147, 149 and 151 are driven by electric motors 171, 173, 175 and 177, respectively, secured on the base 153. By means of the screw spindles (145, 147), a first support 179 can be displaced in a direction parallel to the X coordinate direction, while by means of the screw spindles (149, 151) a second support 181 can be displaced in a direction parallel to the Y coordinate direction. The first support 179 is constituted by two running nuts 183 and 185, which constitute a bridge between two rods 187 and 189 extending parallel to the Y coordinate direction. The second support 181 is constituted by two running nuts 191 and 193, which constitute a bridge between two rods 195 and 197 extending parallel to the X coordinate direction. A carriage 199 provided with rollers 201, 203, 205 and 207 guided along the rods 195 and 197 and with rollers 209 and 211 guided along the rods 187 and 189 is displaceable within the framework of the said rods in the X and Y coordinate directions with respect to the first support 179 and the second support 181. This displacement of the carriage 199 by means of the supports 179 and 181 forms the first step in a two-step displacement of a table 213, which has a foot 215 with a static gas bearing. The foot 215 is journalled thereby on the plate-shaped base 153. For the sake of simplicity, the upper part of the table 213 is not shown in FIG. 11. This upper part in principle has the same construction as the table 101 of FIGS. 1 and 2. The lower part of the table 213 is provided with mounting surfaces 217 for the upper part (not shown). In this respect, reference is made to FIG. 12, in which the table 213 is indicated diagrammatically so as to be separated from the supports 179 and 181. In fact, in this manner it is emphasized that the table 213 is coupled to the carriage 199 not mechanically, but solely by Lorentz forces obtained by coil systems and magnet systems of linear electric translation motors.

The carriage 199 is provided with three coil systems 219, 221 and 223, which are provided with pairs of coils (225, 227), (229, 231) and (233, 235), respectively. The coils in one pair are wound in opposite senses. Opposite to the coil systems 219, 221 and 223, corresponding pairs of permanent magnets (237, 239), (241, 243) and (245, 247) are arranged, which are mounted in the table 213. The position of these magnets not shown in FIG. 11 is indicated by dotted lines. Corresponding coil systems and magnet systems, in the carriage 199 and in the table 213, respectively, constitute linear electric translation motors for the displacement of the table with respect to the carriage in the X and Y coordinate directions. In FIG. 11, arrows 249, 251 and 253 indicate to which displacement directions the coil systems 219, 221 and 223 correspond. The permanent magnets in one pair are magnetized in opposite senses in a direction parallel to the Z coordinate direction.

The displacement of the table 213 to a desired position is regulated in the manner described below. In principle, the regulation of the displacement of the table 101 is equal to that of the table 213. The support 13 in FIG. 1 corresponds to the support 179 in FIG. 11 and the catcher 15 corresponds to the carriage 199. In the positioning device 143 shown in FIG. 11, with respect to the positioning device 1 shown in FIG. 1 the coil systems 85 and 87 in the support 13 with their corresponding magnet systems 93-99 in the table 101 are replaced by the coil systems 219 and 223 in the carriage 199 and by the magnet pairs (237, 239) and (245, 247) in the table 213. Since the second support 181 in FIG. 11 with its drive avoids the use of comparatively long coil systems 85 and 87 (cf. FIG. 1), in operation a uniform temperature distribution in the central part of the positioning device is obtained. The two screw spindle drives of the support 181 are moreover less expensive than the two linear motors with comparatively long coil systems 85 and 87. On the other hand, the translation motors with the long coil systems 85 and 87 of the positioning device 1 are rapid and accurate as compared with the screw spindle drives.

The positioning device 143 shown in FIGS. 11 and 12 is provided with a control device comprising a first feedback control for the carriage 199 and a second feedback control for the table 213. For this purpose, the control device is provided with a digital set-point generator 255 common to the first and the second feedback control. Between the first feedback control for the carriage and the second feedback control for the table there is a relation in such a sense that the position sensors (interferometers) of the second feedback control to be described hereinafter are dominant and determinative for the desired end position of the table 213. The set-point generator 255 may be a generator of position signals, as the case may be in combination with speed signals and acceleration signals. The control device will be described with reference to two position feedback loops for the carriage 199 and the table 213, respectively. If present, the speed and acceleration feedback loops are analogous to a great extent to the position feedback loops. From the set-point generator 255, position signals are supplied via signal leads 257 and 259 to two pairs of summators (or summation circuits) (216, 263) and (265, 267) acting as a comparator, which signals represent the desired X, Y position for the first support 179 and the second support 181, respectively. The output signals of the comparators 261, 263, 265 and 267 are supplied to controllers 269, 271, 273 and 275 and are then supplied as controlled signals to amplifiers 277, 279, 281 and 283. As controllers, so-called PD or PID controllers may be used as well as controllers comprising a so-called observer or process simulator. The controlled and amplified signals are supplied via a main signal lead 284 (a so-called "data bus") and via signals leads 285, 287, 289 and 291 to the direct current motors 171, 173, 175 and 177, which are provided with angle sensors 293, 295, 297 and 299. By means of signal leads 301, 303, 305 and 307, the output signals of the angle sensors 293, 295, 297 and 299 are fed back to the comparators 261, 263, 265 and 267.

For the sake of clarity, in FIG. 12, the table 213, which is coupled functionally and not mechanically to the second support 181, is also shown so as to be separated therefrom.

From the set-point generator 255, position signals corresponding to the X and Y coordinate directions and the angular position $\phi_z$ of the table 213 are supplied via signal leads 309, 311 and 313 to summators 315, 317 and 319, respectively, acting as a comparator. The output signals of the comparators 315, 317 and 319 are supplied to controllers 321, 323 and 325, which may be of the same kind as the controllers 269, 271 and 273. The controlled signals are then supplied to an amplifier 327 and a signal transformation circuit 328, respectively, comprising amplifiers 329 and 331 and are passed via the main signal lead 284 and signal leads 333, 335 and 337 to the coil systems 219, 221 and 223 in the carriage 199 (see also FIG. 11). The circuit 328 carries out a converted operation on the signals as compared with the operation carried out by an addition/subtraction circuit 355. For the positioning of the table 213, use is made of a position sensor 339 shown diagrammatically in FIG. 12, which comprises three known interferometers. One of the interferometers corresponds to the $X_t$ coordinate of the center 341 of the table 213, which coincides with the origin of the X-Y coordinate system in the neutral positions of the table 213, the first and second supports 179 and 181, respectively, and the carriage 199 and supplies a relevant position signal at a signal lead 345, which is connected to the comparator 315. The two remaining interferometers correspond both to the Y coordinate direction and to the angular position $\phi_z$. At two fixed positions in the X-Y coordinate system, the $Y_t$ coordinate is measured by means of the two last-mentioned interferometers. The electrical signals $Y_{1t}$ and $Y_{2t}$ corresponding to the measurement values thus obtained are passed to the addition/subtraction circuit 355 via signal leads 347 and 349, respectively, and multipliers 351 and 353, respectively, having a multiplication factor $\frac{1}{2}$. By means of a summator 357 in the circuit 355, which is connected both to the signal lead 347 and to the signal lead 349, an average $Y_t$ value of the center 341 is obtained at a signal lead 359, which is connected to the comparator 317 via a multiplier 361 having a multiplication factor 2. By means of a subtractor 363 in the circuit 355, which is also connected to the signal leads 347 and 349, an electrical signal representative of $\phi_z$ is obtained at a signal lead 365, which is connected to the comparator via a multiplier 367. The multiplication factor of the multiplier 367 is 2K, where K represents a goniometric factor of the angular position $\phi_z$.

The control of the table 213 therefore takes place by means of a control device as shown in FIG. 12. The control device comprises a first feedback control 369 and a second feedback control 371 for the carriage 199 and the table 213, respectively. These feedback controls 369 and 371 already described above are indicated in FIG. 12 by a frame of dotted lines. In operation, the set-point generator 255 operates simultaneously for the positioning of the carriage 199 and the table 213. The position sensor 339 with the three interferometers in the feedback control 371 is considerably more accurate than the comparatively inexpensive angle sensors 293, 295, 297 and 299 in the feedback control 369. The angle sensors are suitable for such a positioning accuracy of the carriage 199 that two conditions are fulfilled. The first condition implies that the relative position of the coil systems 291, 221 and 223 in the carriage 199 and the magnet system (237, 239), (241, 243) and (245, 247) in a plane parallel to the X-Y coordinate system remains within a margin of a linear force-current relation of the coil systems and magnet systems acting as linear motors. The second condition implies that the deviation of the carriage 199 with respect to the end position given after a displacement lies within the sweep or relative displacement of the coil systems (219-223) and the magnet systems (237-247) in the carriage 199 and the table 213, respectively. The said two conditions can be fulfilled with the angle sensor usually employed in direct current motors. The feedback control 369 of the carriage 199 can be constructed so that the feedback signals of the angle sensors are negated from the instant at which the carriage 199 has arrived within the described sweep of the table 213. In an analogous manner as for the position, for the speed and the acceleration use may also be made of set points guaranteeing a prescribed speed and acceleration variation. In combination therewith, known techniques for track description may be used, in which the track is approximated by polynomes. For very accurate track descriptions, polynomes higher than first order polynomes are available.

The rotation $\phi_z$ is obtained in that the outer coil systems for the Y coordinate direction of the carriages (15, 199) are energized so that the driving forces from the righthand and lefthand sides either are of the same sense and are different in value or are of opposite sense and have the same value.

In the embodiment of the positioning device shown in FIGS. 1 to 10, two stepping motors 63 and 65 are used instead of the two direct current motors 171 and 173 in the embodiment shown in FIG. 12 for the coarse displacement of the table 101 in the X coordinate direction. For the coarse displacement in the Y coordinate direction use is made of only one stepping motor 75 instead of the two stepping motors 175 and 177. It should be pointed out that with the fine displacement in the Y coordinate direction in the first positioning device the coil systems C1 and C2 are located not on the carriage 15 comparable with the carriage 199 of the second positioning device, but on the support 13. The coil system (123, 125) for the fine displacement in the X coordinate direction in the first positioning device is located, like the coil system 221 of the second positioning device, on the relevant carriage, however. It is also possible, however, to replace in the first positioning device the coil system (123, 125) on the carriage 15 by a number of coil sections on the support 13 distributed over the length of the support 13. The carriage 15 could then be omitted. During the displacement of the table 101 in the Y coordinate direction, the table 101 can be held in the X coordinate direction by energization of one of the said coil sections on the support 13. Due to the fact that in the second positioning device the coil system 221 is situated on the carriage 191, for each Y coordinate the table 213 can be held in the X coordinate direction.

The positioning device described is particularly suitable for exposure of semiconductor wafers in optolithographic devices (so-called wafer steppers). Further, the positioning device can be used in those cases in which objects must be displaced over comparatively great distances with a very high positioning accuracy because the degree of accuracy with respect to known two-step positioning devices is less dependent upon the distance over which an object must be displaced.

We claim:

1. A positioning device comprising a carriage displaceable in at least two coordinate directions with respect to a base and intended for displacement of a table which is displaceable with respect to the carriage in said two coordinate directions, characterized in that, in operation, the table is coupled to the carriage solely by Lorentz forces of magnet systems and coil systems and occupies, viewed in a third coordinate direction transverse to said two coordinate directions, a position with respect to the carriage which is determined by a static gas bearing acting between the base and the table.

2. A positioning device as claimed in claim 1, characterized in that the positioning device is provided with a coil system secured to a support and guide for the carriage displaceable in one of the coordinate directions and with a further coil system secured to the carriage, while the table is provided with magnet systems arranged opposite to the two said coil systems, coil systems and magnet systems corresponding to each other constituting linear electric motors for the displacement and guiding of the table with respect to the carriage in a second coordinate direction and in said one coordinate direction, respectively.

3. A positioning device as claimed in claim 1, characterized in that the positioning device is provided with a carriage guided by a first support displaceable in one coordinate direction and by a second support displaceable in a second coordinate direction, while the table is provided with magnet systems arranged opposite to coil systems in the carriage, magnet systems and coil systems corresponding to each other constituting linear electric motors for the displacement and guiding of the table with respect to the carriage in the one coordinate direction and in the second coordinate direction, respectively.

4. A positioning device as claimed in claim 1, characterized in that the positioning device is provided with a position sensor, which is coupled to the table and with respect to which, during operation, a position signal determines a difference signal of a control device, which defines an end position of the table, which control device comprises a first feedback control of the carriage and a second feedback control of the table operating simultaneously and having a common set-point generator, the set-point generator generating in the first feedback control a series of set points establishing the position of the carriage within a margin determined by the second feedback control of the table in a linear force-current range of the relevant magnet systems and coil systems.

* * * * *